United States Patent
Wood

(10) Patent No.: US 7,169,233 B2
(45) Date of Patent: Jan. 30, 2007

(54) REACTOR CHAMBER

(75) Inventor: Eric R. Wood, Queen Creek, AZ (US)

(73) Assignee: ASM America, Inc., Phoenix, AZ (US)

( * ) Notice: Subject to any disclaimer, the term of this patent is extended or adjusted under 35 U.S.C. 154(b) by 268 days.

(21) Appl. No.: 10/719,416

(22) Filed: Nov. 21, 2003

(65) Prior Publication Data

US 2005/0109275 A1   May 26, 2005

(51) Int. Cl.
C23C 16/00 (2006.01)
H01L 21/00 (2006.01)

(52) U.S. Cl. .................................... 118/724; 118/715

(58) Field of Classification Search ......... 118/715–733
See application file for complete search history.

(56) References Cited

U.S. PATENT DOCUMENTS

| | | |
|---|---|---|
| 3,598,082 A | 8/1971 | Rice |
| 3,627,590 A | 12/1971 | Mammel |
| 3,744,964 A | 7/1973 | Hart |
| 4,076,859 A | 2/1978 | Schladitz |
| 4,108,108 A | 8/1978 | Schladitz |
| 4,188,519 A | 2/1980 | Berg |
| 4,539,933 A | 9/1985 | Campbell et al. |
| 4,545,327 A | 10/1985 | Campbell et al. |
| 4,558,660 A | 12/1985 | Nishizawa et al. |
| 4,630,669 A * | 12/1986 | Kessler et al. .............. 165/169 |
| 4,803,948 A | 2/1989 | Nakagawa et al. |
| 4,807,562 A | 2/1989 | Sandys |
| 4,834,022 A * | 5/1989 | Mahawili .................... 118/725 |
| 4,886,449 A | 12/1989 | Brittin |
| 4,920,918 A | 5/1990 | Adams et al. |
| 4,920,920 A | 5/1990 | Shigeki |
| 4,950,918 A | 8/1990 | O'Breartuin |
| 5,038,395 A | 8/1991 | Lenski |
| 5,062,386 A | 11/1991 | Christensen |
| 5,085,887 A | 2/1992 | Adams et al. |
| 5,108,792 A | 4/1992 | Anderson et al. |
| 5,179,677 A | 1/1993 | Anderson et al. |
| 5,244,694 A * | 9/1993 | Ozias ....................... 427/248.1 |
| 5,421,893 A | 6/1995 | Perlov |
| 5,421,957 A | 6/1995 | Carlson et al. |
| 5,532,457 A | 7/1996 | Cobb et al. |
| 5,551,982 A | 9/1996 | Anderson et al. |
| 5,695,567 A * | 12/1997 | Kordina et al. ............. 118/725 |
| 5,792,273 A | 8/1998 | Ries et al. |
| 6,076,482 A * | 6/2000 | Ding et al. ............. 118/723 R |
| 6,093,252 A | 7/2000 | Wengert et al. |
| 6,143,079 A | 11/2000 | Halpin |
| 6,159,297 A | 12/2000 | Herchen et al. |
| 6,245,149 B1 | 6/2001 | de Lomenie et al. |
| 6,290,806 B1 | 9/2001 | Donohoe |

(Continued)

FOREIGN PATENT DOCUMENTS

JP   60-161616   8/1985

*Primary Examiner*—Karla Moore
(74) *Attorney, Agent, or Firm*—Knobbe Martens Olson & Bear LLP

(57) ABSTRACT

A semiconductor processing chamber having an upper wall, a lower wall, and two side walls. The upper and lower walls each comprise two thin, flat plates that are slightly out of parallel so that the wall has a pitch. The pitches point away from the interior chamber space to enable the chamber to withstand reduced pressures.

14 Claims, 3 Drawing Sheets

U.S. PATENT DOCUMENTS

| | | |
|---|---|---|
| 6,383,330 B1 | 5/2002 | Raaijmakers |
| 6,540,837 B2 | 4/2003 | Raaijmakers |
| 6,545,863 B2 | 4/2003 | Huggins |
| 2002/0033232 A1 | 3/2002 | Raaijmakers |

* cited by examiner

REACTOR CHAMBER

BACKGROUND OF THE INVENTION

1. Field of the Invention

This invention relates generally to semiconductor processing chambers, and relates more particularly in one embodiment to the wall structure of the chamber to improve structural integrity of the process chamber for low pressure applications.

2. Description of the Related Art

Process chambers for thermally processing semiconductor wafers typically are made of quartz (vitreous silica) or similar material because quartz is substantially transparent to radiant energy. Radiant heaters may be positioned adjacent the exterior of the chamber, and a wafer being processed in the chamber can be heated to elevated temperatures without having the chamber walls heated to the same level. Furthermore, quartz is desirable because it can withstand very high temperatures, and its inert characteristics enable it to withstand degradation by various processing gases.

For applications in which the pressure within a quartz chamber is to be reduced much lower than the surrounding ambient pressure, cylindrical or spherical chambers often are utilized because their curved surfaces are capable of withstanding the inwardly directed force. However, when positioning a flat wafer for chemical vapor deposition purposes where the deposition gases flow parallel to the wafer, it is desirable that the chamber walls be substantially parallel to the facing flat surface of the wafer, to obtain uniform deposition on the wafer surface. Uniform deposition is critical to obtain a high yield of acceptable products to be made from such wafer. However, a flat wall will collapse inwardly with reduced interior pressure sooner than will an outwardly convex wall of similar size and thickness.

To handle the inwardly directed forces on flat wall chambers, gussets or ribs have been provided on the exterior of the walls extending generally perpendicular to the wall to which they are joined, as may be seen in U.S. Pat. No. 4,920,918, issued on May 1, 1990, titled PRESSURE-RESISTANT THERMAL REACTOR SYSTEM FOR SEMICONDUCTOR PROCESSING, all of which is hereby incorporated by reference and made a part of this specification. One disadvantage of such a design is that even though quartz is substantially transparent to the radiant lamp energy, the rib sections present a region of much thicker quartz, and thus the ribs locally absorb more lamp energy and attenuate the lamp energy delivered to the wafer. This attenuation of energy causes cooler regions (i.e., shadows) on the wafer. Such non-uniformity of temperature on the wafer surface reduces the quality of the films that may be grown thereon, particularly for process conditions that are temperature-sensitive.

Temperature non-uniformities typically may be somewhat reduced by rotating the wafer during processing. Rotation causes regions of the wafer that would otherwise reside within shadows all of the time to pass into warmer regions, as well. Thus, rotation tends to distribute temperatures of the wafer surface somewhat more uniformly. It has been found, however, that if the ribs positioned forward of the wafer center (i.e., the axis of rotation of the wafer) are located at approximately the same distance from the wafer center as are the ribs positioned rearward of the wafer center, temperature uniformity suffers even with rotation. Specifically, forward and rearward ribs positioned at relatively similar distances from the wafer center cause a combined shadowing effect on the surface of the rotating wafer which can result in temperature distributions that are more non-uniform than can otherwise be achieved.

SUMMARY OF THE INVENTION

Briefly stated, the invention provides a semiconductor processing chamber having an upper wall and a lower wall configured to withstand reduced pressure in the chamber. The upper and lower walls comprise thin, flat plate-like elements each of which comprise two rectangular segments that are slightly out of parallel so that the wall has a pitch. The pitches of the upper and lower walls generally point away from the interior chamber space. In one embodiment, the upper and lower walls are formed by bending each wall so that it has a pitch. In another embodiment, the walls are formed by welding the segments together so that each wall has a pitch. The chamber is made from a generally transparent material such as quartz. The walls are joined at their side edges to side walls which are preferably formed from a generally translucent material such as bubble quartz. The walls enclose an all-quartz interior surface, except for apertures used for gas inlet and outlet.

In one embodiment, a reaction chamber is provided. The reaction chamber comprises a chamber upper wall and a chamber lower wall. Each wall has an inner surface and an outer surface and defines a reaction space therebetween. An inlet flange is secured at a forward end of the chamber to the upper and lower walls. An outlet flange is secured at a rearward end of the chamber to the upper and lower walls. A substrate support is provided within the reaction space. The substrate support has a central axis around which the substrate support rotates. A heat source is provided above the chamber, and a heat source is provided below the chamber. The chamber upper wall and the chamber lower wall each comprise two rectangular segments that are slightly out of parallel such that each of the chamber upper wall and the chamber lower wall has a pitch.

In another embodiment, a reaction chamber comprises a chamber upper wall and a chamber lower wall made of a transparent material which is heat resistant and non-reactive with gases introduced into the chamber. The chamber upper wall and chamber lower wall each comprise two, flat rectangular segments that are slightly out of parallel such that each of the chamber upper wall and the chamber lower wall has a pitch. The pitches point away from each other.

In another embodiment, a method of forming a reaction chamber is provided. The method comprises joining an upper chamber wall to a first edge of a first side wall and a first edge of a second side wall. A lower chamber wall is joined to a second edge of the first side wall and a second edge of the second side wall. The lower and upper chamber walls and first side wall and second side wall form a reaction space having a first opening and a second opening disposed on opposite ends of the reaction space. An inlet flange is joined to the first opening, and an outlet flange is joined to the second opening.

DETAILED DESCRIPTION OF THE PREFERRED EMBODIMENTS

Although certain preferred embodiments and examples are disclosed below, it will be understood by those skilled in the art that the invention extends beyond the specifically disclosed embodiments to other alternative embodiments and/or uses of the invention and obvious modifications and equivalents thereof. Thus, it is intended that the scope of the invention herein disclosed should not be limited by the particular disclosed embodiments described below.

Figure 1:
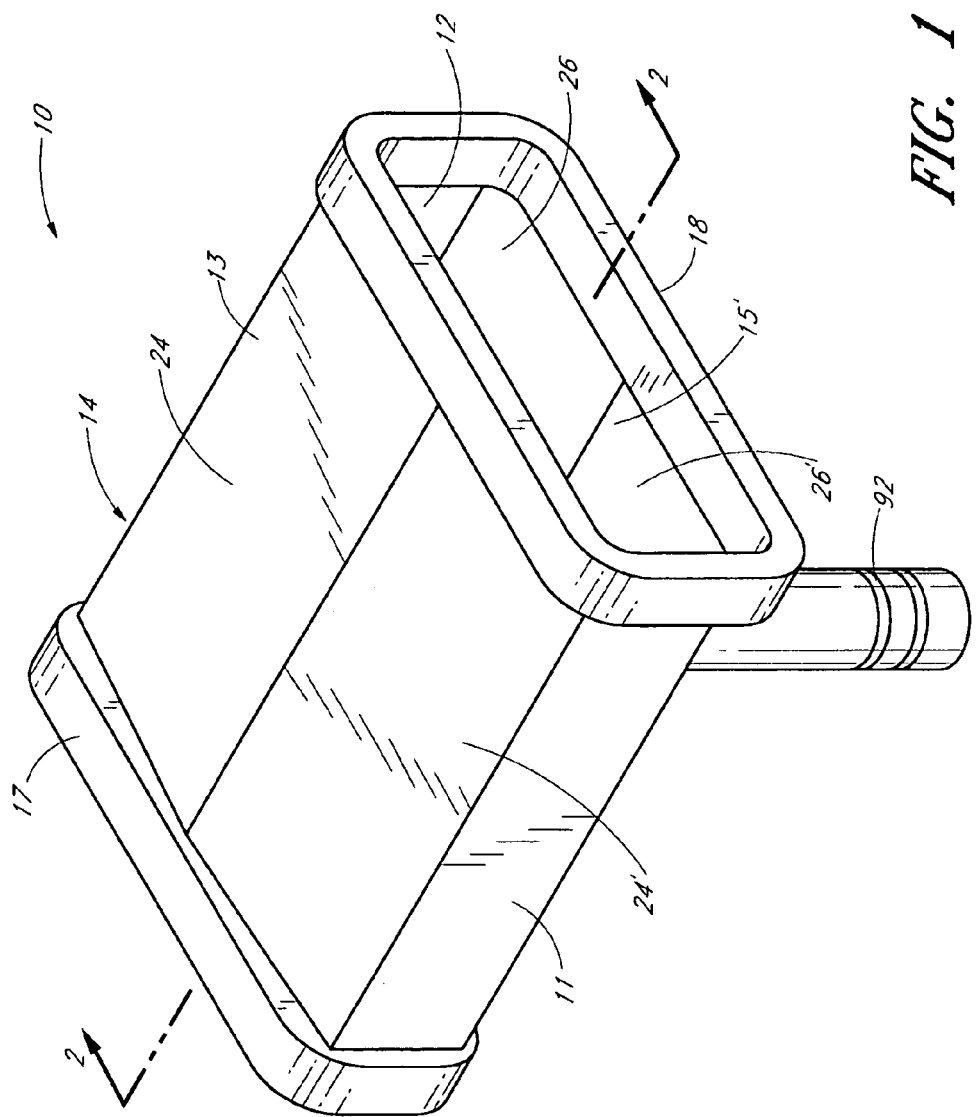
FIG. 1 is a perspective view of a semiconductor processing chamber having upper and lower walls that provide a tent-shaped cross-sectional area to the chamber.
Figure 2:
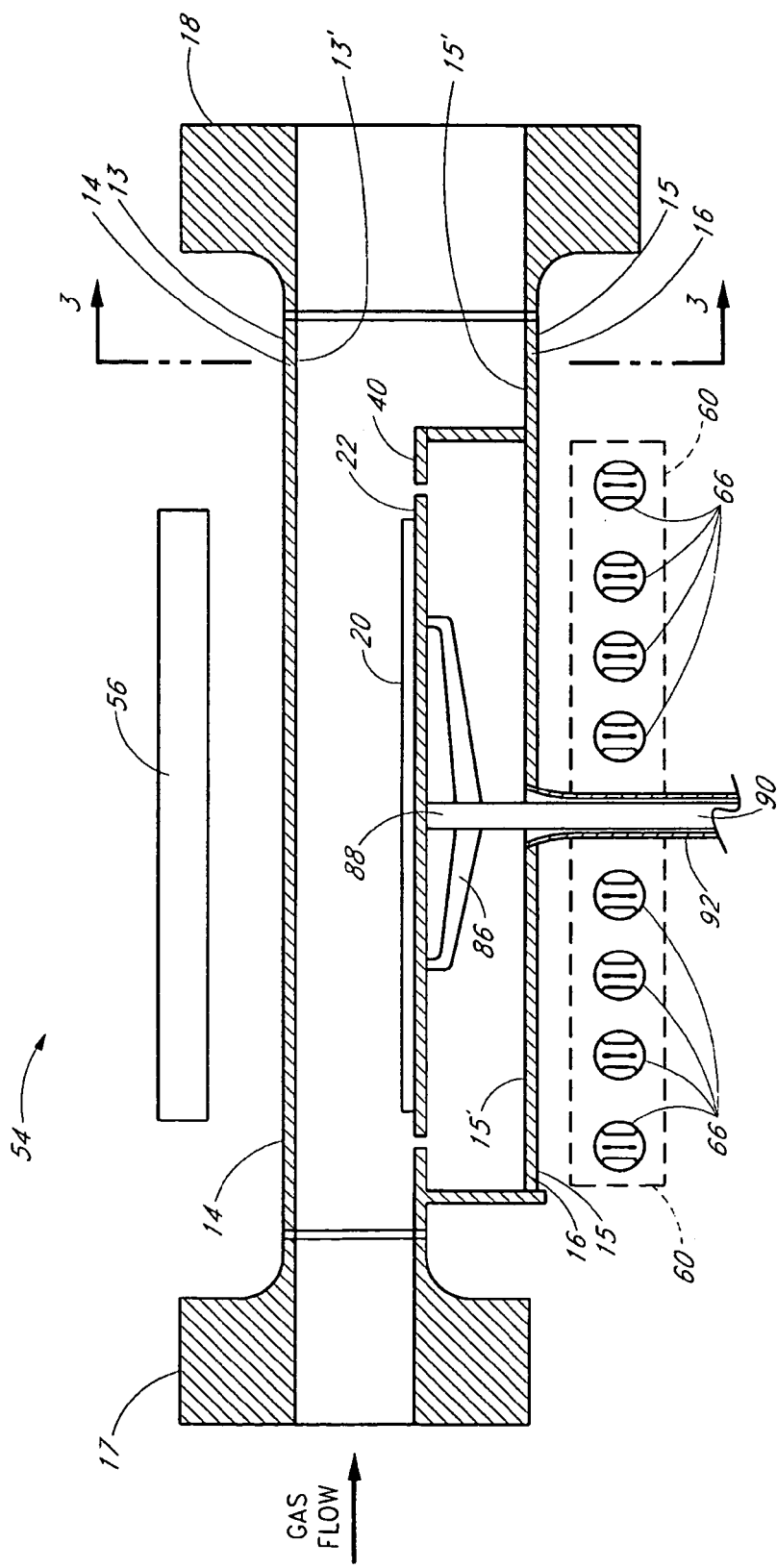
FIG. 2 is a cross-sectional view of the semiconductor processing chamber of FIG. 1, taken along line 2—2, illustrating the positions of a susceptor and wafer within the chamber.
Figure 3:
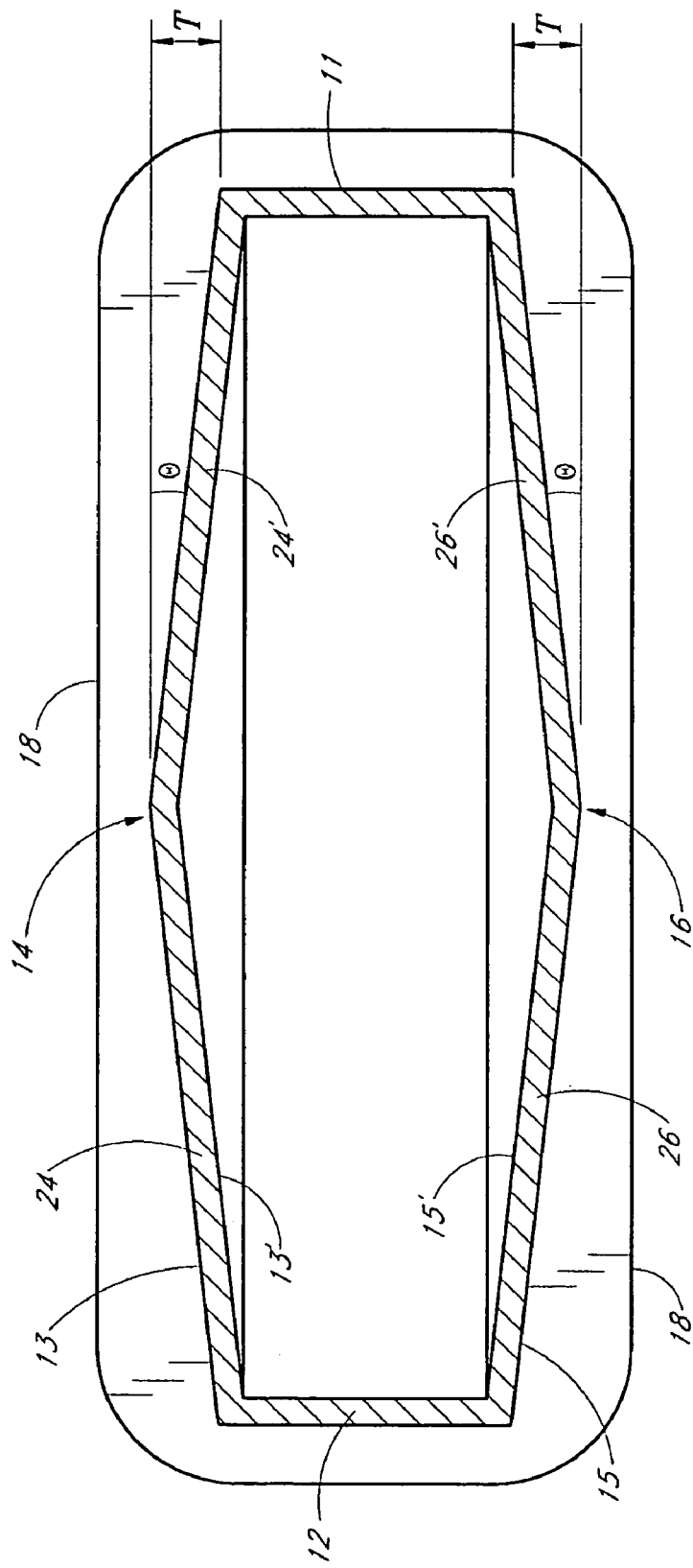
FIG. 3 is a cross-sectional view of the semiconductor processing chamber of FIG. 1, taken along line 3—3 of FIG. 2, illustrating the tent-shaped cross-sectional area of the chamber.

FIGS. 1–3 illustrate one embodiment of a reactor vessel or chamber 10 for chemical vapor processing. As can be seen, the chamber 10 has an elongated, generally flattened configuration. As best illustrated in FIG. 2, the chamber 10 has an upper wall 14 with an outer surface 13 and an inner surface 13', and a lower wall 16 with an outer surface 15 and an inner surface 15'. The walls 14, 16 are connected by vertically short side walls 11 and 12. The walls 11, 12, 14, 16 are joined by an upstream inlet flange 17 and a downstream outlet flange 18. Upstream and downstream relate to the direction of process gas flow through the chamber 10 and are synonymous in the present description with front and rear, as well as with frontward and rearward.

The chamber height is less than the chamber width. In this respect, a longitudinal direction for the chamber 10 extends from the inlet flange 17 to the outlet flange 18, or along the section line 2—2. A lateral direction extends between the side walls 11, 12, or transversely to section line 2—2. The height direction is perpendicular to both the longitudinal and lateral axes. In one embodiment, the chamber 10 has a length of about 300 mm, a width of about 206 mm, and a height of about 66.7 mm. In other embodiments, the width of the chamber 10 generally is about 3 times the height of the chamber 10. The chamber 10 is designed for processing a substrate such as a single silicon wafer 20 illustrated in FIG. 2. It will be understood, however, that the advantages of this embodiment are equally applicable to batch wafer processing furnaces, whether for deposition, etching, anneal, dopant diffusion, photolithographic, or other processes for which elevated temperatures are desired. Additionally, substrates may comprise different materials, such as glass.

The dimensions of the chamber 10 will obviously be modified for different size wafers. For example, the illustrated embodiment of the chamber 10 is suitable for processing wafers having diameters of 200 mm, 300 mm and even larger. Preferably, the relative cross-sectional dimensions will remain the same, and thus a larger diameter chamber to accommodate 300-mm wafers will have a larger height. The increased height in the chamber for 300-mm wafers will necessitate certain modifications to other subsystems, such as radiant heat lamps disposed around the chamber for heating the susceptor and wafer, described below. In short, although the surrounding environments for processing 200 mm and 300 mm diameter wafers may necessarily differ in certain respects, these differences are within the skill of one practiced in the art of process chamber construction and operation. The particular dimensions are, of course, given merely by way of example.

It will be appreciated that minimizing the height of the chamber 10 is desirable so that the side walls 11, 12 can withstand at least as much pressure as the walls 14, 16. In view of this, the width of the chamber 10 generally is about 3 times the height of the chamber 10. However, the thickness of the side walls 11, 12 can also be varied in accordance with the level of pressure contemplated.

The wafer 20 is supported within the chamber 10 in any suitable fashion. For example, the illustrated wafer 20 is supported by a susceptor 22. The susceptor 22 preferably comprises a material opaque to radiant heat energy, such as graphite or silicon carbide, as is known in the art of semiconductor processing equipment. The susceptor 22 and wafer 20 combination are held at a desired height within the reaction chamber 10 by a support structure, as shown in FIG. 2. The susceptor 22 is supported on arms 86 of a suitable support 88 connected to the upper end of a rotatable shaft 90 that extends through a tube 92 depending from the bottom wall of the chamber 10. The susceptor 22 is shown approximately level with the upper surface of a support plate :40. This facilitates positioning the wafer 20 above the susceptor 22 of the process chamber 10. Further details regarding interior chamber support assemblies, and other details about a semiconductor process chamber, can be found in U.S. Pat. No. 6,093,252, issued on Jul. 25, 2000, titled PROCESS CHAMBER WITH INNER SUPPORT, the entirety of which is hereby incorporated by reference and made a part of this specification.

An upper heating array 54 is mounted above the chamber 10. A plurality of radiant heating elements or lamps 56 are mounted within the upper heating array 54. Desirably, the heating lamps 56 are of an elongated tube type, disposed in spaced parallel relation and also substantially parallel with the reactant gas flow path through the underlying reaction chamber 10. Likewise, a lower heating array 60 is mounted below the chamber 10. The lower heating array 60 is similar in configuration to the upper heating array 54. A plurality of radiant heating elements or lamps 66 are housed within the lower heating array 60. Desirably, however, the lower heating lamps 66 comprise elongated tubes arranged transverse to the gas flow path, and accordingly transverse to the heating lamps within the upper heating array 54. The lower heating array 60 can also include separate concentrator lamps (not shown) to compensate for a cold spot created near/within the center of the wafer 20 by the tube 92 and the rotatable shaft 90 supporting the susceptor 22.

The lamps 56, 66 are preferably of similar configuration. Each of the elongated tube type heating elements 56, 66 is preferably a high intensity tungsten filament lamp having a transparent quartz envelope containing a halogen gas, such as iodine. The lamps produce radiant heat energy in the form of full-spectrum light, transmitted through the reaction chamber walls 14, 16 without appreciable absorption. As is known in the art of semiconductor processing equipment, the power of the various lamps 56, 66 can be controlled independently or in grouped zones in response to temperature sensors arranged in proximity to the substrate 20.

The lamps 56, 66 are illustrated in FIG. 2, without showing a detailed supporting structure. One of skill in the art, however, will readily recognize a number of manners of mounting the lamps relative to the chamber walls 14, 16. Preferably, each lamp 56, 66 includes an integrally formed axially extending lug on each of its opposite ends and a suitable connection pin arrangement extending from each of the lugs for receiving connectors provided at the end of electrical conductors. Details regarding heating arrays, spacing between heating arrays and chamber walls, as well as techniques for mounting lamps relative to chamber walls can be found in the above-mentioned U.S. Patent, titled PROCESS CHAMBER WITH INNER SUPPORT, incorporated by reference herein.

In accordance with the invention, both the upper wall 14 and the lower wall 16 comprise thin, flat plate-like elements having a rectangular shape. The upper wall 14 is further comprised of a first segment 24 which is joined to a second segment 24'. The segments 24, 24' are joined slightly out of parallel so that the wall 14 has a pitch T, as best shown in FIG. 3. The pitch T gives each of the segments 24, 24' a slope angle θ relative to the horizontal. Likewise, the lower wall 16 comprises a first segment 26 which is joined to a second segment 26'. The segments 26, 26' are joined slightly out of parallel so the wall 16 has a pitch T which is substantially similar to the pitch T of the upper wall 14. Moreover, the pitch T gives the segments a slope angle θ relative to the horizontal. The walls 14, 16 of the chamber 10 are oriented so that the pitches T of the walls point outwards from the center of the chamber. As can be seen in FIG. 3, the presence of the pitches T gives each of the walls 14, 16 an interior angle which is less than about 180°.

In one embodiment, the walls 14, 16 are monolithic with the segments 24, 24', 26, 26' formed by folding, or bending, the walls 14, 16, respectively. In another embodiment, the wall 14 is formed by welding the segments 24, 24' together such that the pitch T is formed, and the wall 16 is formed by welding the segments 26, 26' together such that the pitch T is formed. The pitch T of the walls 14, 16 preferably is at least about 13 mm, or about 6% of the width of the chamber 10. Furthermore, as shown in FIG. 3, each of the slope angles θ is about 7°. Although in the illustrated embodiment, the pitch of the walls 14 is equal in size to the pitch of the wall 16; in other embodiments, the pitches of the walls 14, 16 may have different sizes. Still, in other embodiments, wherein the chamber 10 encloses a larger volume than illustrated herein, the pitch T may be greater than about 6.2% of the chamber width.

Alternatively, the chamber 10 may comprise a mixed-wall chamber having an upper wall 14 which has a pitch T and a lower wall 16 which is flat. In still another mixed-wall embodiment, the chamber 10 may comprise an upper wall 14 which is flat and a lower wall 16 with has a pitch T. It will be appreciated that the flat walls used with mixed-wall chambers will be thicker than the pitched walls so as to withstand the general stresses of reduced internal pressures.

With continuing reference to FIG. 3, it will be appreciated by those skilled in the art that the pitched walls 14, 16 give the chamber 10 greater strength than would be otherwise achievable with a similar chamber having flat walls. Because of this, the chamber 10 has a probability of failure, under vacuum conditions at process temperatures, which is substantially less than that of other chambers. More specifically, it has been determined that utilizing the pitched walls 14, 16 instead of flat walls reduces the Nominal Weibull Probability of Failure from about 2% to about 1%, reduces stress by about 8.4%, and increases the Safety Factor from about 1.18 to about 1.29 (i.e., an increase of about 9.6%). Moreover, the pitched walls 14, 16 provide the chamber 10 with additional strength without greatly changing the overall dimensions of the chamber 10, and thus employing the chamber 10 in place of previous, flat-walled chambers requires few changes to system components exterior to the chamber 10. Moreover, because the pitched walls 14, 16 provide the chamber 10 with a "near-rectangular" cross-sectional area, the chamber 10 more uniformly distributes radiation on the wafer 20.

The walls 14, 16 and 11, 12 of the chamber 10 are preferably formed of a material resistant to thermal stress and transparent to certain ranges of radiant energy. More preferably, the walls are made from a transparent quartz material. In one embodiment, the walls have a thickness of between about 4 and about 6 millimeters, and more preferably the wall thickness is approximately 5 millimeters. Although quartz is preferred, other materials having similar desirable characteristics may be substituted. Some of these desirable characteristics include a high melting point, the ability to withstand large and rapid temperature changes, chemical inertness, and high transparency to light.

The end flanges 17, 18 are preferably translucent and fabricated from quartz having nitrogen bubbles dispersed therein. The translucent-end flanges 17, 18 scatter radiant energy to reduce "light-piping" therethrough. This protects O-rings and other parts outside the chamber 10 from exposure to extreme temperatures generated within the chamber 10. The end flanges 17, 18 are preferably constructed by machining.

The walls 14, 16 may be monolithic or formed from the segments 24, 24', 26, 26,' respectively, fused together at their ends, as discussed above. In one embodiment, the fusing procedure may comprise using quartz rod as filler weld material between the edges of the segments, and using a torch or other local heat source, similar to a brazing procedure. Segments may be fused together before or after being fused to the chamber 10. Preferably, thermal annealing is used at least once, and more preferably several times, during the fusion of the segments to remove local stresses induced by the fusion procedure.

As described above, quartz is the preferred material for the walls 11, 12, 14, 16 because of its transparency and temperature resistance to the radiant lamps 56, 66 used to heat the wafer 20. An all-quartz configuration is also much easier to cool than chambers containing non-quartz components. In addition, quartz is a non-reactive material that does not degrade easily. Other materials may react with the gases introduced into the chamber, thereby producing contaminants while creating structural problems in these non-quartz components. Although quartz is preferred, other materials having similar desirable characteristics may be substituted. Some of these desirable characteristics include a high melting point, the ability to withstand large and rapid temperature changes, chemical inertness, and high transparency to light.

Although preferred embodiments of the invention have been described in detail, certain variations and modifications will be apparent to those skilled in the art, including embodiments that do not provide all of the features and benefits described herein. Accordingly, the scope of the invention is not to be limited by the illustrations or the foregoing descriptions thereof, but should be defined by reference to the appended claims.

What is claimed is:

1. A reaction chamber, comprising:
    a chamber upper wall and a chamber lower wall made of a transparent material which is heat resistant and non-reactive with gases introduced into said chamber;
    wherein said chamber upper wall and said chamber lower wall each comprise two, flat rectangular segments that are slightly out of parallel such that each of said chamber upper wall and said chamber lower wall has a pitch, wherein both an inner surface and an outer surface of each wall have a pitch that points in the same direction as the pitch of the wall, and wherein the pitches of the upper and lower walls point away from each other.

2. The reaction chamber of claim 1, further comprising an inlet flange secured at a forward end of said chamber to said upper and lower walls, and an outlet flange secured at a rearward end of said chamber to said upper and lower walls.

3. The reaction chamber of claim 1, wherein said pitches of said walls comprise a bend in each of said chamber upper wall and said chamber lower.

4. The reaction chamber of claim 1, wherein said pitches of said walls comprise a joint between two rectangular segments.

5. The reaction chamber of claim 4, wherein said joint comprises a welded connection which joins said two rectangular segments.

6. The reaction chamber of claim 1, wherein each of said upper and lower chamber walls has a thickness ranging between about 4 and about 6 millimeters.

7. The reaction chamber of claim 6, wherein said thickness is about 5 millimeters.

8. The reaction chamber of claim 1, wherein said pitch of said walls is at least about 13 millimeters.

9. The reaction chamber of claim 1, wherein said pitch of said walls is at least about 6% of the width of said chamber.

10. The reaction chamber of claim 1, wherein the rectangular segments slope at an angle of less than about 10° with respect to horizontal.

11. The reaction chamber of claim 1, wherein the rectangular segments slope at an angle of about 7° with respect to horizontal.

12. The reaction chamber of claim 1, wherein the rectangular segments slope at an angle with respect to horizontal such that the segments form an interior angle which is slightly less than 180°.

13. The reaction chamber of claim 1, wherein the chamber width is about 3 times the chamber height.

14. The reaction chamber of claim 1, further comprising:
a substrate support provided within said chamber, said substrate support having a central axis around which said substrate support rotates; and
at least one heat source provided outside of said chamber, said heat source being positioned either above or below said chamber.

* * * * *